(12) United States Patent
Levinski et al.

(10) Patent No.: US 9,678,421 B2
(45) Date of Patent: Jun. 13, 2017

(54) TARGET ELEMENT TYPES FOR PROCESS PARAMETER METROLOGY

(71) Applicant: KLA-Tencor Corporation, Milpitas, CA (US)

(72) Inventors: Vladimir Levinski, Migdal HaEmek (IL); Feler Yoel, Haifa (IL); Daniel Kandel, Aseret (IL)

(73) Assignee: KLA-Tencor Corporation, Milpitas, CA (US)

( * ) Notice: Subject to any disclaimer, the term of this patent is extended or adjusted under 35 U.S.C. 154(b) by 42 days.

(21) Appl. No.: 14/795,549

(22) Filed: Jul. 9, 2015

(65) Prior Publication Data
US 2015/0309402 A1   Oct. 29, 2015

Related U.S. Application Data

(63) Continuation of application No. PCT/US2014/064851, filed on Nov. 10, 2014.

(60) Provisional application No. 61/910,355, filed on Dec. 1, 2013.

(51) Int. Cl.
| | |
|---|---|
| *G03F 1/42* | (2012.01) |
| *G06F 17/50* | (2006.01) |
| *G03F 7/20* | (2006.01) |
| *H01L 21/66* | (2006.01) |

(52) U.S. Cl.
CPC ............ *G03F 1/42* (2013.01); *G03F 7/70625* (2013.01); *G03F 7/70641* (2013.01); *G03F 7/70683* (2013.01); *G06F 17/5072* (2013.01); *H01L 22/30* (2013.01)

(58) Field of Classification Search
CPC ............... G01N 21/4785; G01N 21/47; G01N 21/9501; G03F 1/42; G06F 17/5072
See application file for complete search history.

(56) References Cited

U.S. PATENT DOCUMENTS

| | | | |
|---|---|---|---|
| 7,545,520 B2 | 6/2009 | Lee et al. | |
| 7,916,284 B2 | 3/2011 | Dusa et al. | |
| 9,123,649 B1* | 9/2015 | Manassen | G01B 11/14 |
| 9,151,712 B1* | 10/2015 | Adel | G01N 21/47 |
| 2005/0195398 A1* | 9/2005 | Adel | B82Y 10/00 356/401 |
| 2006/0012764 A1* | 1/2006 | Kawashima | G03F 7/70091 355/53 |
| 2007/0058169 A1* | 3/2007 | Ausschnitt | G03F 7/70633 356/401 |
| 2011/0249244 A1* | 10/2011 | Leewis | G03F 7/706 355/27 |

(Continued)

OTHER PUBLICATIONS

Brunner, T.A. et al. "Process Monitor Gratings", Proc. of SPIE vol. 6518, 651803-1 through 9, 2007.

(Continued)

*Primary Examiner* — Sang Nguyen
(74) *Attorney, Agent, or Firm* — Suiter Swantz pc llo

(57) ABSTRACT

Metrology targets, target design methods and metrology methods are provided. Metrology targets comprise target elements belonging to two or more target element types. Each target element type comprises unresolved features which offset specified production parameters to a specified extent and thus provide sensitivity monitoring and optimization tools for process parameters such as focus and dose.

22 Claims, 7 Drawing Sheets

(56) References Cited

U.S. PATENT DOCUMENTS

2013/0271740 A1* 10/2013 Quintanilha ............ G03F 1/144
　　　　　　　　　　　　　　　　　　　　　355/67
2014/0141536 A1　 5/2014 Levinski et al.
2015/0177135 A1* 6/2015 Amit ...................... G01N 21/47
　　　　　　　　　　　　　　　　　　　　　702/150

OTHER PUBLICATIONS

Ausschnitt, Christopher, P., et al. "Seeing the forest for the trees: a new approach to CD control", SPIE vol. 3332, 1998, pp. 212-220.
Brunner, T. A. et al. "Quantitative stepper metrology using the focus monitor test mask", Proc. of SPIE, vol. 2197, 1994, pp. 541-549.

* cited by examiner

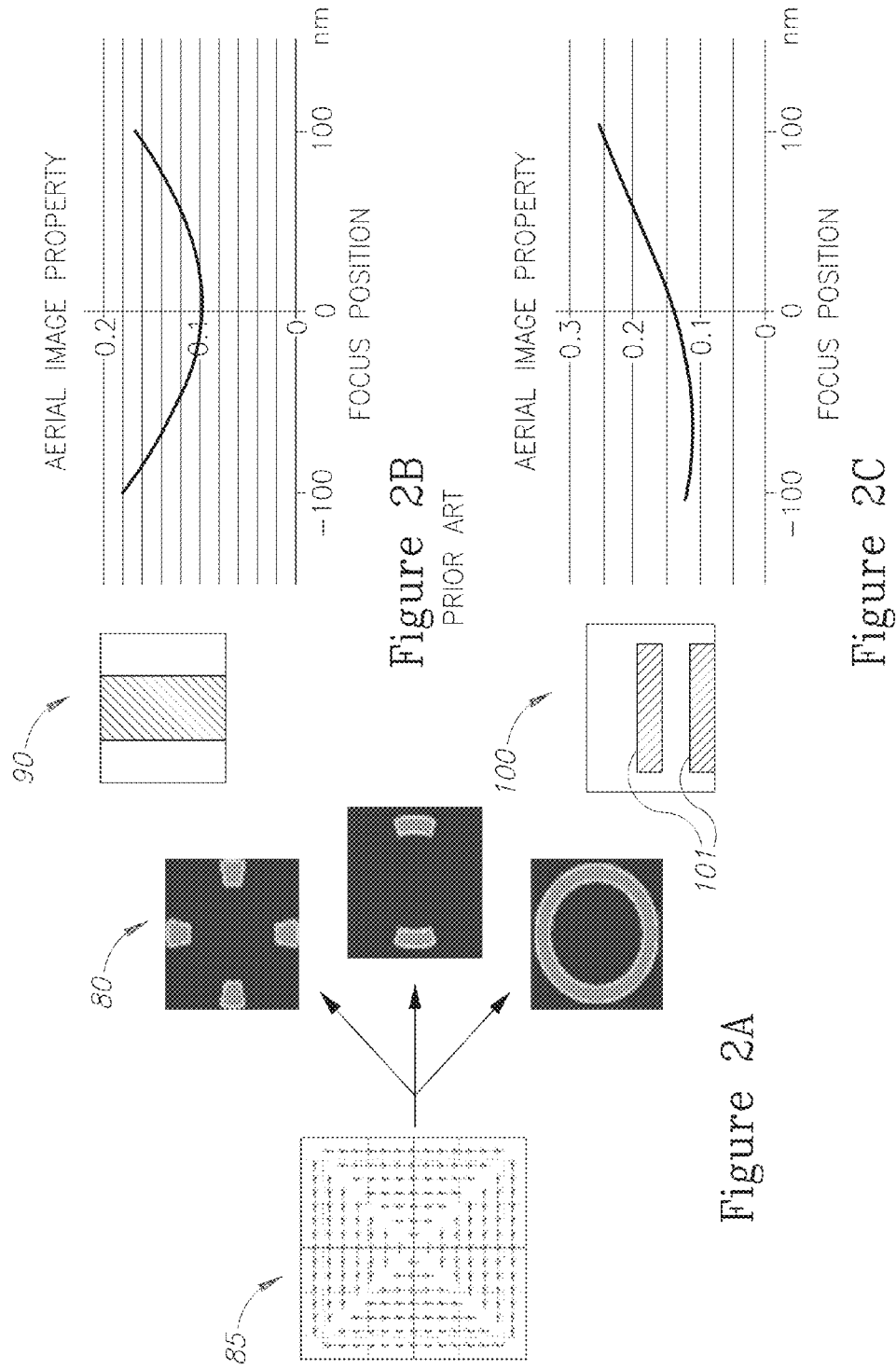

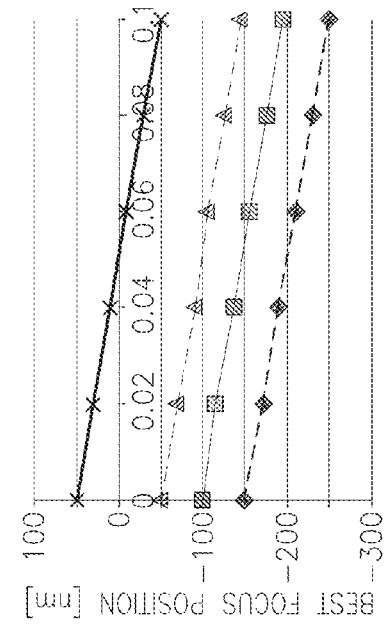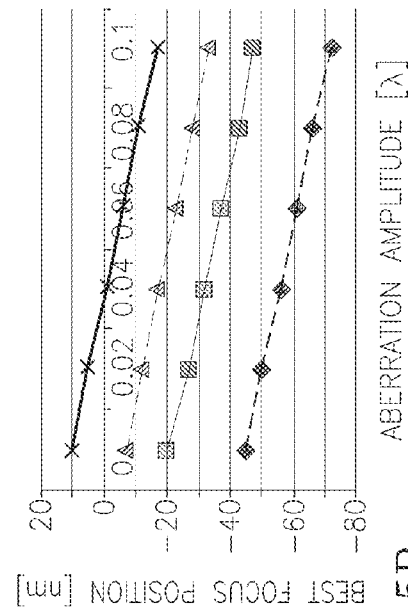
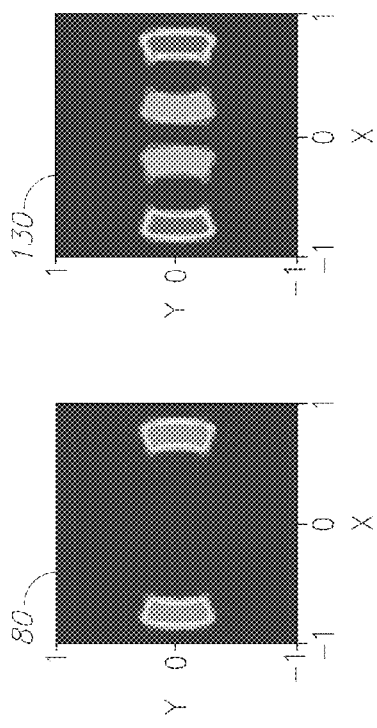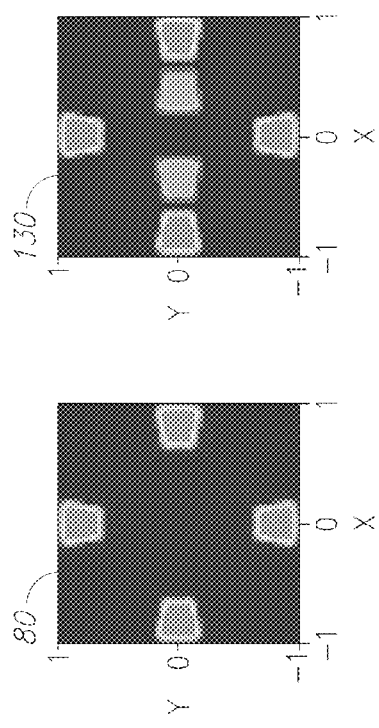
Figure 5A
Figure 5B

_200_

- 205 — DESIGNING A METROLOGY TARGET USING TARGET ELEMENTS BELONGING TO 2-5 TARGET ELEMENT TYPES, EACH TYPE COMPRISING UNRESOLVED FEATURES WHICH OFFSET PRODUCTION PARAMETER(S) TO A SPECIFIED EXTENT
- 210 — SHIFTING PRODUCTION SENSITIVITY OF THE PARAMETERS TO AROUND THE TOOL FOCUS POSITION
- 212 — USING MUTUALLY PARALLEL UNRESOLVED FEATURES
- 214 — USING MUTUALLY PERPENDICULAR UNRESOLVED FEATURES
- 215 — USING COMBINATIONS OF PARALLEL AND PERPENDICULAR SEGMENTATIONS OF TARGET STRUCTURES
- 217 — INTERCONNECTING AT LEAST SOME OF THE SEGMENTS
- 220 — CONFIGURING THE RATIO OF PARALLEL AND PERPENDICULAR SEGMENTATIONS OF THE TARGET STRUCTURE TO DETERMINE THE SPECIFIED EXTENT OF THE OFFSET OR SHIFT
- 225 — SELECTING TARGET ELEMENT PITCH TO BE BETWEEN ONE AND TWO TIMES THE MINIMAL DESIGN RULE PITCH
- 230 — MODIFYING SCANNER FOCUS AND/OR DOSE USING THE TARGET ELEMENT TYPES

Figure 7

TARGET ELEMENT TYPES FOR PROCESS PARAMETER METROLOGY

CROSS REFERENCE TO RELATED APPLICATIONS

This application is filed under 35 U.S.C. §120 and §365(c) as a continuation of International Patent Application Serial No. PCT/US14/64851, filed on Nov. 10, 2014, which application claims the benefit under 35 U.S.C. 119(e) of U.S. Provisional Patent Application No. 61/910,355, filed on Dec. 1, 2013, which applications are incorporated herein by reference in their entirety.

FIELD OF THE INVENTION

The present invention relates to the field of metrology, and more particularly, to process parameter metrology.

BACKGROUND OF THE INVENTION

Current target designs approaches use isolated lines and isolated lines with assist features for sensitivity enhancement. Software generates a library of simulated spectra, using material properties (n and k of resist, antireflective coatings, planarization films, etc.), nominal test target structure (line width, sidewall angle and height), reasonable expected range of target structure variation, and scatterometry tool optical parameters (wavelength range, azimuth angle range, angle of incidence range, polarizations, etc.). FEM (focus exposure matrix) test wafers, produced on this basis, are then exposed and spectra are collected from test targets for all combinations (if possible) of focus and exposure in the FEM. Closest match for each spectrum is found in the library. Corresponding structure parameters (line width, sidewall angle, line height, etc.) for the library matches are matched up with the programmed focus and exposure combinations from the FEM. The resulting target sensitivity is not sufficient to provide the required accuracy and precision even for the recent node. The sensitivity enhancement of the printed pattern to the scanner focus changes achieved due to using of assist features as described e.g., in T. A. Brunner, C. P. Ausschnitt, Process Monitor Gratings. Proc. of SPIE Vol. 6518, 2007 and in U.S. Pat. No. 7,916,284 may be limited by a printability of the pattern in a whole range of scanner parameters and allowable range of process parameters.

Line end shortening effect measured by imaging tool (Christopher P. Ausschnitt, Mark E. Lagus, Seeing the forest for the trees: a new approach to CD control. SPIE Vol. 3332, 1998) suffers from a low sensitivity especially around the best scanner focus position where the behavior of measured target parameter is parabolic as a function of the scanner focus change.

Use of phase shift masks (see T. A. Brunner, et al., "Quantitative stepper metrology using the focus monitor test mask", Proc. of SPIE, Vol. 2197, 1994 and U.S. Pat. No. 7,545,520 as examples) allows achieving a very high sensitivity to scanner focus changes by converting of focus changes into alignment errors that can be measured with an overlay measurement tool. However phase shift masks are not used in production since it leads to a significant rise in reticle prices.

Current target designs require some trade-off between target sensitivity and target printability which ends up with a relatively low sensitivity of printed patterns to the scanner focus changes, thus current methods have either low precision or low accuracy or long "time to result".

U.S. Patent Application Publication No. 2014/0141536, which is incorporated herein by reference in its entirety, discloses a segmented mask that includes a set of cell structures, wherein each cell structure includes a set of features having an unresolvable segmentation pitch along a first direction, wherein the unresolvable segmentation pitch along the first direction is smaller than the illumination of the lithography printing tool, wherein the plurality of cell structures have a pitch along a second direction perpendicular to the first direction, and wherein the unresolvable segmentation pitch is suitable for generating a printed pattern for shifting the best focus position of the lithography tool by a selected amount to achieve a selected level of focus sensitivity.

BRIEF SUMMARY OF THE INVENTION

One aspect of the present invention provides a metrology target comprising a plurality of target elements belonging to at least two target element types, wherein each target element type comprises unresolved features which offset at least one specified production parameter to a specified extent.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 2A is a schematic illustration of the achievement of production parameters sensitivity by design of unresolved features, according to an embodiment of the invention;

FIG. 2B is a schematic illustration of the achievement of production parameters sensitivity by design of unresolved features, according to an embodiment of the invention;

FIG. 2C is a schematic illustration of the achievement of production parameters sensitivity by design of unresolved features, according to an embodiment of the invention;

FIG. 5A is a high level schematic illustration of illumination considerations in using target element types, according to an embodiment of the invention;

FIG. 5B is a high level schematic illustration of illumination considerations in using target element types, according to an embodiment of the invention;

DETAILED DESCRIPTION OF THE INVENTION

Figure 1A:
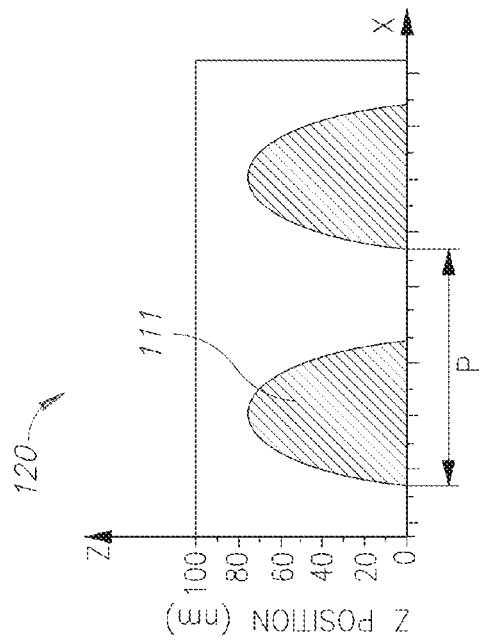
FIG. 1A is a high level schematic illustration of a target element type and the resulting production and focus sensitivity thereof, according to an embodiment of the invention.

Prior to the detailed description being set forth, it may be helpful to set forth definitions of certain terms that will be used hereinafter.

The term "target element" as used in this application refers to any part of a metrology target.

The term "target structure" as used in this application refers to a part of a target which is designed and produced in a way that it is resolved during the lithography process, i.e., the produced structure is similar to the designed structure.

The term "unresolved feature" as used in this application refers to a feature of a target element which is designed but not produced as designed by the lithography tool, i.e., the respective produced features are different from the designed features. For example, target designs may comprise unresolved features which are much smaller than the target structure and consequently are not produced by the lithography tool.

The term "segmentation" as used in this application refers to a subdivision of a target structure into unresolved features, which are referred to in this application by the term "segments".

It is noted that the terms "resolved" and "unresolved" relate to specific directions. For example, a fine line may be resolved with respect to its length but unresolved with respect to its width. Hence, a bar with fine longitudinal segmentation may be produced as a full bar with a resolved long dimension but unresolved transverse segmentation features.

The terms "target element type" or "archetypes" as used in this application refer to specific types of target elements as described below, which generally combine, by design, unresolved features or segments at specified geometric patterns.

The terms "parallel" and "perpendicular" as used in this application refer to the relative orientation of unresolved features or segments within the target element or the target element type. In certain embodiments, parallel features are in a direction which is resolved by the lithography tool while perpendicular features are unresolved. The terms "horizontal" and "vertical" as used in this application refer in a non-limiting manner to features of the specific illustrated examples, with respect to the orientation of the respective figures.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

U.S. Patent Publication No. 2014/0141536 discloses a new concept of mask design, creating shifts of best focus position of printed patterns. This approach provides both sensitivity enhancements over a whole focus range of interest and solves the specific problem of extremely low sensitivity of standard line-space targets around the best focus position of devices (nominal focus position on product wafers). However, U.S. Patent Publication No. 2014/0141536 includes full lithography simulation based on preliminary knowledge of scanner illumination conditions, mask materials and topography as well as resist properties and development process parameters. This information is hardly available for the most processes, which require developing of new principles of focus offset target design based on reduced knowledge of lithography and process parameters.

Metrology targets, target design methods and metrology methods are provided. Metrology targets comprise target elements belonging to two or more target element types. Each target element type comprises unresolved features which offset specified production parameters to a specified extent and thus provide sensitivity monitoring and optimization tools for process parameters such as focus and dose.

Certain embodiments of the present disclosure (i) present new approaches for target design for scanner parameters measurement (for example, focus and dose measurement) which provide a high sensitivity to scanner parameters changes without deterioration of the robustness of printed patterns, (ii) show that the suggested targets allow separating the measurement of scanner focus shift from the effect of scanner aberrations which allows usage of one calibrated recipe for different scanners having different aberration sets, and (iii) illustrates the application of focus/dose offset targets for best focus position measurement on FEM wafer.

Figure 1B:
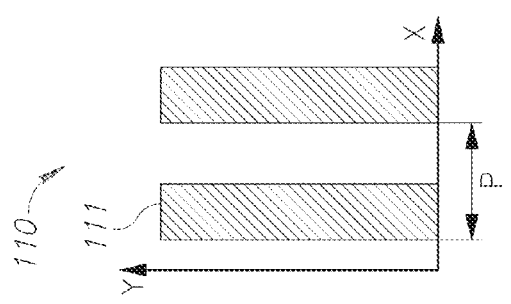
FIG. 1B is a high level schematic illustration of a target element type and the resulting production and focus sensitivity thereof, according to an embodiment of the invention.
Figure 1C:
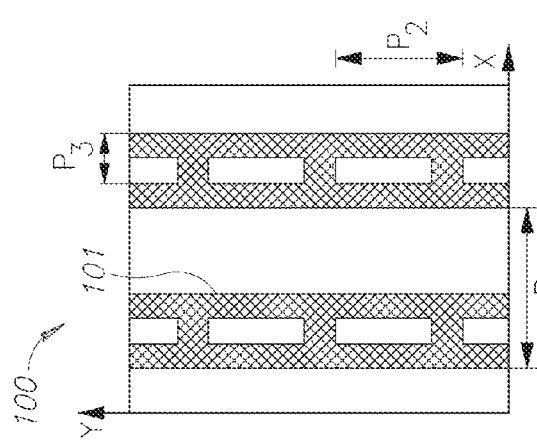
FIG. 1C is a high level schematic illustration of a target element type and the resulting production and focus sensitivity thereof, according to an embodiment of the invention.
Figure 1D:
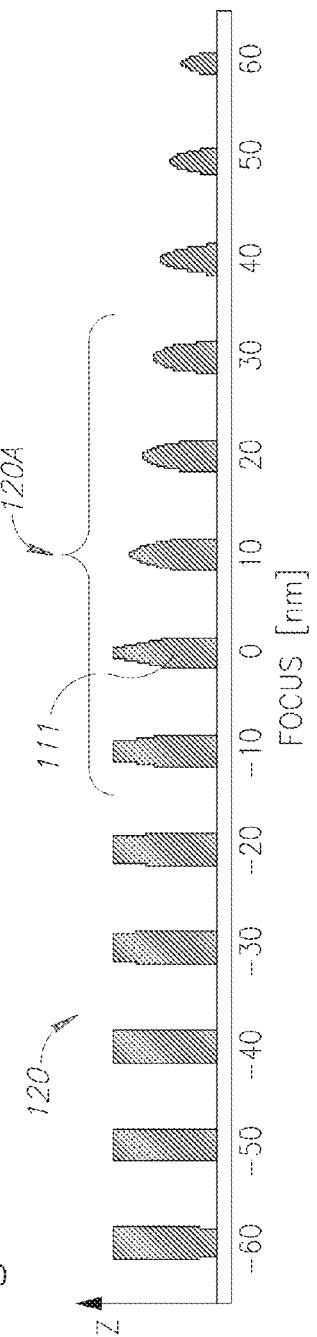
FIG. 1D is a high level schematic illustration of a target element type and the resulting production and focus sensitivity thereof, according to an embodiment of the invention.

FIGS. 1A-1D are high level schematic illustrations of a target element type 100 and the resulting production and focus sensitivity thereof, according to some embodiments of the invention. FIG. 1A schematically illustrates an example for unresolved features 102A, 102B within target elements 101 of type 100. Target element type 100 is characterized by parameters $p_1$, $p_2$, $p_3$ which define the specified geometric patterns of unresolved features 102A, 102B as designed or as produced on a mask. For example, $p_1$ may range between 100 nm and 150 nm, $p_2$ may range between 50 nm and 100 nm and $p_3$ may range between 10 nm and 50 nm. FIG. 1B schematically illustrates a wafer top view of the respective produced pattern 110 with elements 111 resulting from target elements 101. While pitch p of elements 111 may be similar to $p_1$, unresolved features 102A, 102B are not produced directly as any feature of elements 111, hence their designation as unresolved features. FIG. 1C schematically illustrates a wafer cross section view of the respective produced pattern 120 resulting from target elements 101. While pitch p of the pattern (elements 111) may be similar to $p_1$, unresolved features 102A, 102B are not produced directly as any feature of the pattern. However, as illustrated in FIG. 1D, unresolved features 102A, 102B are designed to convey a sensitivity of produced elements 111 in pattern 120 to production parameters such as scanner focus or dose. In the illustrated example, varying scanner focus to a specified extent yields different patterns 120A due to the underlying design of unresolved features 102A. 102B in target elements 101. Specifically, offsetting the focus within the range of −10 nm to ca. 30 nm results in differences in produced elements 111 which are clearly identifiable. Hence, disclosed metrology targets which comprise a plurality of target elements 101 belonging to at least two target element types 100, wherein each target element type 100 comprises unresolved features 102 which offset at least one specified production parameter to a specified extent, provide sensitivity to the respective production parameters and allow monitoring their settings.

FIGS. 2A-2C schematically illustrates the achievement of production parameters sensitivity by design of unresolved features, according to some embodiments of the invention. FIG. 2A schematically illustrates an exemplary scanner illumination scheme 85 which enhances the sensitivity in various illumination patterns 80 (see details below). For typical scanner illumination conditions the basic target designs (archetypes) 100 can be provided even without most of the information listed above. The most significant property of the illumination condition for the focus offset targets design is polarization scheme 85. As an example, XY polarization scheme 85 which is usually used with dipole, quadruple or annular illuminations patterns 80 is shown in FIG. 2A. FIG. 2B schematically illustrates a prior art target structure 90 without unresolved features 102 which is relatively insensitive to production parameter offsets, as exemplified in the graph illustrating the dependency of an aerial image property on the focus position. Specifically, target structure 90 yield a low sensitivity of the aerial image property on the focus position as it is produced at the minimum of their functional dependency. In contrast, FIG. 2C schematically illustrates the sensitivity of target structure 101 according to one of types 100 exhibiting unresolved features 102 (see FIGS. 3 and 4 for exemplary details). Resulting from the incorporation of unresolved features 102 the dependency of the aerial image property on the focus position is not at a minimum (or maximum) and thus exhibits high sensitivity to offsets (deviations) in the respective production parameters such as scanner focus. Stated differently, while prior art target structures 90 yield best values of respective production parameters (e.g., focus) which are close to the zero offset (e.g., ca. 5 nm in FIG. 2B), disclosed target structures 101 yield best values of respective production parameters (e.g., focus) which are far from the zero offset (e.g., ca. −60 nm in FIG. 2C).

In certain embodiments, the sensitivity to production parameters is shifted to the region around the focused position of the lithography tool, a shift which enables correcting for focus deviations while keeping the lithography tool focused. While using prior art targets the region around the focused position of the lithography tool is characterized by low sensitivity to focus deviations (as the minimum of the sensitivity function is around the zero focus position FIG. 2B), using certain embodiments of the disclosed targets the region around the focused position of the lithography tool is characterized by high sensitivity to focus deviations (as the minimum of the sensitivity function is away from the zero focus position, the latter having a sloping sensitivity function FIG. 2C). The inventors have found out that designing targets with unresolved features of the disclosed types contributes to the shifting of production sensitivity of the parameters to the region around the tool focus position (or equivalently to shifting of the focus position away from the sensitivity minimum region).

For the targets with pitch lying between the minimal design rule pitch and two times the minimal design rule pitch the aerial image is constructed as a result of the interference between zero and +1 diffraction orders created by the left half of the illumination system and of the interference between zero and −1 diffraction orders created by the right half of the illumination system. Accordingly the aerial image intensity can be described as in Equation 1.

$$I = A + B \cdot \cos(\Phi + \alpha \cdot \Delta F) \cdot \cos\left(\frac{2\pi}{P}x\right) \qquad \text{Equation 1}$$

where $\Phi$ depends on the mask design and corresponds to the phase difference between zero and +1 or −1 diffraction orders. The best focus position definition based on aerial image described in Equation 1 is defined in Equation 2.

$$\Phi + \alpha' \Delta F_{BEST} = \pi \qquad \text{Equation 2}$$

The mask topography and mask materials are usually chosen to provide the phase shift of a for line-space target (attenuated and alternating phase shift masks) and the best focus position in this case is around zero (FIG. 2B). Since the X polarized light contributes only to a constant A (no propagating and captured by the objective lens ±1 diffraction orders for the considered range of pitches are created by the X-polarized illumination sources), the dependence of the aerial image on focus is determined by Y-polarized illumination sources. For vertically polarized light source the splitting of line with permittivity $\epsilon_1$ in vertical direction provides the following expression for the effective permittivity (Expression 3):

$$\epsilon_1 \Rightarrow \frac{\epsilon_1 \cdot \epsilon_2 (1 + \eta)}{\epsilon_2 + \eta \epsilon_1} \qquad \text{Expression 3}$$

where $\epsilon_2$ is the air permittivity and $\eta$ is the duty cycle of the segmentation in vertical direction. Hence, unresolved features 102 in the vertical direction change the phase difference between zero and first diffraction orders and by this way induce sensitivity to production parameters around the working focus position for device production.

Figure 3:
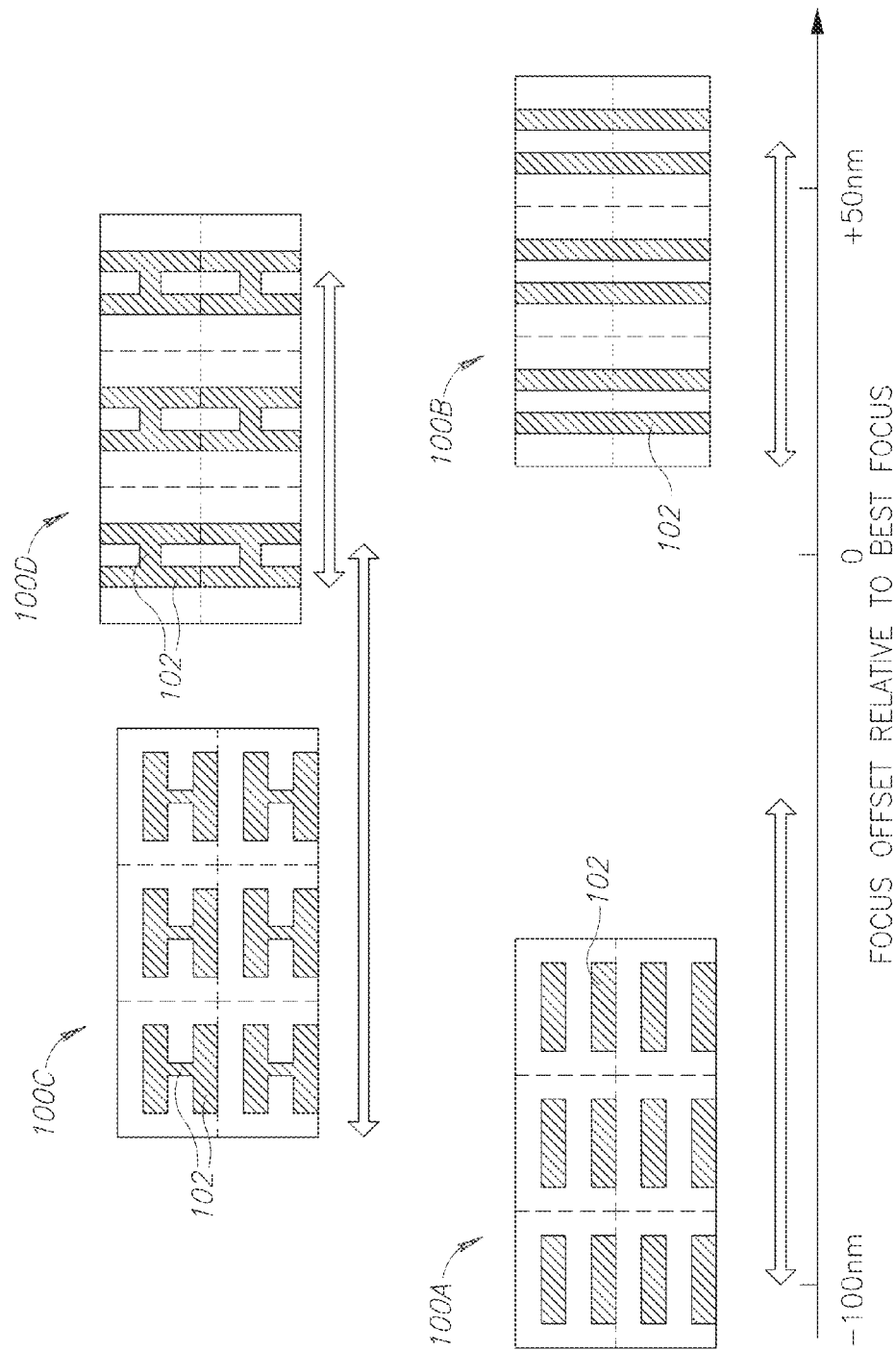
FIG. 3 schematically exemplifies non-limiting examples of target element types comprising unresolved features which offset production parameter(s) and contribute to target production sensitivity thereto, according to some embodiments of the invention.

FIG. 3 schematically exemplifies non-limiting examples of target element types 100 comprising unresolved features 102 which offset production parameter(s) and contribute to target production sensitivity thereto, according to some embodiments of the invention. Target element type 100A, for example, represents a target design with line split in vertical direction (perpendicularly to the direction of the segmented bar), which results in permittivity change according to Expression 3.

Such change of mask optical properties leads to the best focus shift upward, represented by the arrow below the illustrated type 100A, indicating focus offset by e.g., between −100 nm and −40 nm. A different target element type 100B, in which the line splitting in horizontal direction (parallel to the direction of the segmented bar) provides the effective permittivity change expressed in Expression 4:

$$\varepsilon_1 \Rightarrow \frac{\varepsilon_1 + \eta \varepsilon_2}{1 + \eta} \quad \text{Expression 4}$$

which leads to the best focus shift downward, as exemplified by the arrow below the illustrated type 100B, indicating focus offset by e.g., between +10 nm and +60 nm. In both types 100A, 100B, unresolved features 102 are mutually parallel (each type in a different direction corresponding to illumination polarization directions).

Intermediate types 100C, 100D are schematically illustrated at the top of FIG. 3. In such types 100, unresolved features 102 comprise at least one of perpendicular segmentations of the target structure and parallel segmentations of the target structure, of which the segments may be interconnected. Unresolved features 102 of target element types 100 may be configured to determine the specified extent according to a ratio of parallel and perpendicular segmentations of a target structure. In the illustrated examples, type 100C provides an extent of parameter offset between −70 nm and 0 nm while type 100D provides an extent of parameter offset between −10 nm and +30 nm. Combinations of types 100A-D provide multiple sensitivity levels to one or production parameters that enable to quantify the accuracy of the respective parameters.

Figure 4:
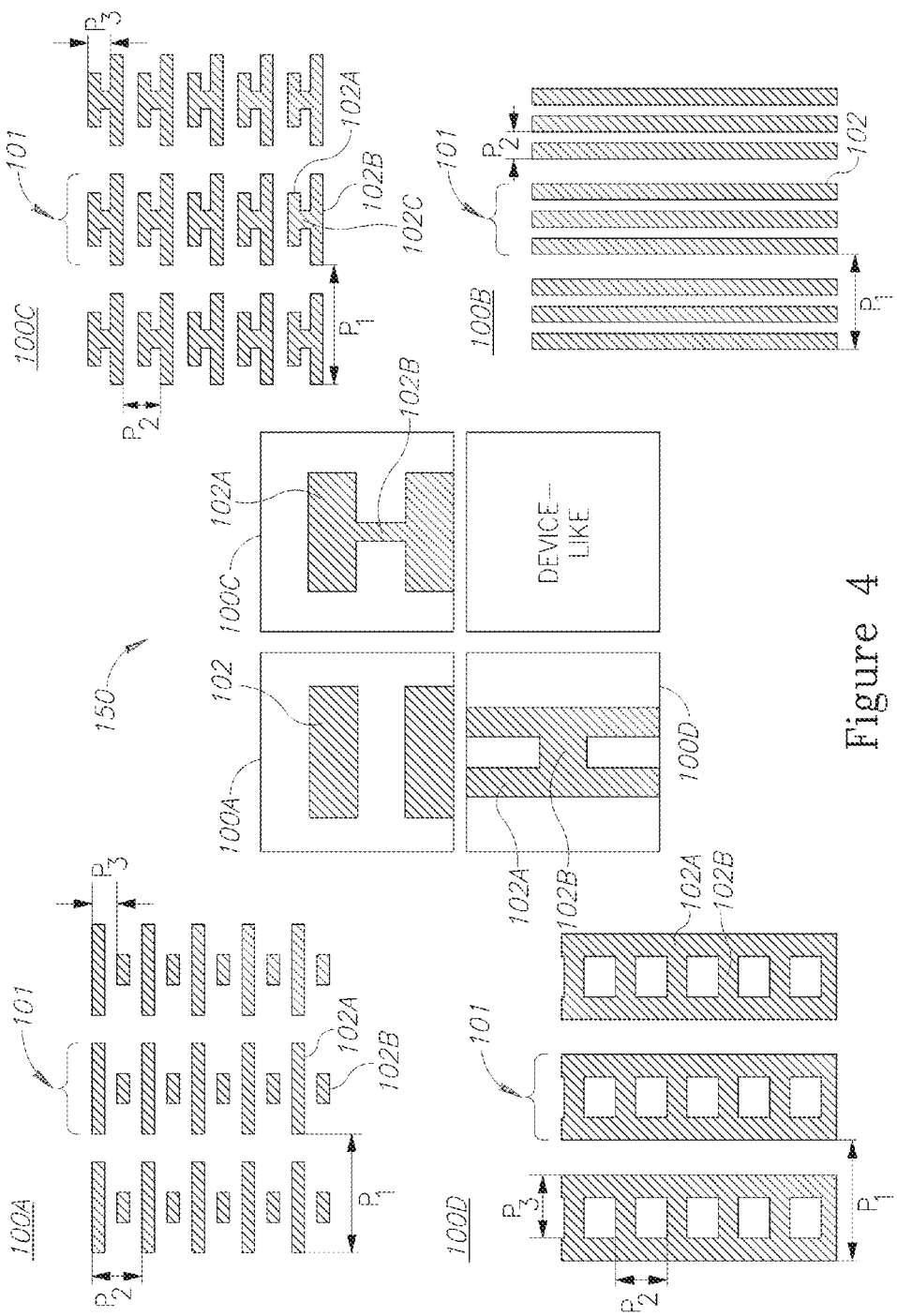
FIG. 4 is a high level schematic illustration of metrology targets having multiple cells with different target element types, according to some embodiments of the invention.

It is noted that all four types 100 are highly sensitive to the production parameters at a part of the process window (in the illustrated non-limiting case, −100 nm to 50 nm in the focus parameter), that in most parts of the process window, at least two types 100 exhibit high sensitivity, and that three properly selected types 100 may be selected to provide good sensitivity over the whole process window (see also additional types 100 in FIG. 4).

In certain embodiments, five target element types 100 were used to achieve the following set of focus sensitivities: 0±130 nm, 70±70 nm, 10±140 nm, 10±140 nm and 0±90 nm characterized by a range of 70 nm in the centers of sensitivity distributions and a common range of 90 nm spanned by all distributions in common, while another groups of five target element types 100 were used to achieve the following set of focus sensitivities: 0±130 nm, 30±70 nm, 0±130 nm, 10±140 nm and 20±70 nm characterized by a range of 30 nm in the centers of sensitivity distributions and a common range of 130 nm spanned by all distributions in common. In such configurations, an experimental reduction of process parameter related errors was achieved. It is noted that types 100 may be selected and configured to provide a plurality of distributions relating to a variety of process parameters.

Similar considerations may be applied for any other polarization configuration (other than the one illustrated in FIG. 2A). Practically, since the exact masks parameters may not be determined without knowing all details of lithographic process (illumination scheme, resist properties, BARC, TARC (bottom and top anti-reflective coatings, respectively) layers parameters), the above archetypes 100 may be used by the following way: to print on a test FEM wafer a set of targets with a chosen pitch (between the minimal design rule and two times of minimal design rule) and different scales of features constituting each archetype, so that one can choose a representative of each archetype 100 which is well printed and sensitive within the required range of focus and dose. The chosen representatives of each archetype 100 may comprise four cells target which may be used for focus and dose measurement on a product wafer. Instead of one of archetypes 100 a standard line-space target may be used as well.

FIG. 4 is a high level schematic illustration of metrology targets 150 having multiple cells with different target element types 100, according to some embodiments of the invention. Metrology target 150 is schematically represented in the center of FIG. 4, while target element types with various unresolved features 102 are exemplified at the periphery of FIG. 4. Target element types 100A, 100C and 100D illustrate different combinations of unresolved features 102, such as target element type 100A comprising unconnected parallel unresolved features 102A, 102B having different sizes, target element type 100D comprising parallel unresolved features 102A interconnected by perpendicular unresolved features 102B (or, similarly, parallel unresolved features 102B interconnected by perpendicular unresolved features 102A), and target element type 100C comprising parallel unresolved features 102A, 102B, interconnected by perpendicular unresolved features 102C. While all features in type 100D are interconnected, interconnection is partial in type 100C. Clearly, any other combinations of unresolved features 102 may be used to yield specified shifts of specific production parameters. The three illustrated types 100A, 100D, 100C are characterized by designed distances $p_1$, $p_2$, $p_3$. Target element type 100B illustrates an example for parallel unresolved features 102, which may be used as device like segmentation in target 150. The ratio of parallel and perpendicular unresolved elements 102 (segments) may be designed to determine the production parameter offset. Targets 150 may be printed with tens or several hundred target elements of different types 100 on a FEM wafer to yield the process sensitivity analysis.

In certain embodiments, non-limiting exemplary relative dimensions of unresolved features 102 may comprise horizontal feature lengths of features 102A, 102B in types 100A, 100C between $p_2/4$ and $p_1$-$p_2/4$, vertical feature length equaling $p_2/4$ and width of feature 102C in type 100C equaling $p_2/3$; length of feature 102B (b) and width of feature 102A (a) in type 100D may relate to be between $p_2/4$ and $p_1/2$-a and between $p_2/4$ and $p_1/2$-$p_2/8$-b/2, respectively, with the width of feature 102B being ca. $p_2/3$. In type 100B, feature widths and feature spacing may be determined according to similar considerations or simulations.

Knowing additional information about illumination conditions (exact light distribution in the illumination pupil and mask parameters) allows significant reduction of amount of targets that have to be printed on the test wafer. Indeed, in this case areal images described by Equation 1 may be simulated for each specific target design. Aerial images may be calculated for any one of the archetypes 100 with different scanner focus positions and an aerial image threshold may be defined to determine the width of the printed line as a distance between points where aerial image meets the threshold (see FIG. 1B). An approximate value of the aerial image threshold can be calculated knowing the illumination conditions and values of mask CD (critical dimension) and printed line CD for any specific design rule target. The printability of patterns corresponding to any specific mask design within the required production parameter ranges (e.g., focus and dose) may be checked using Maxwell solver for aerial image simulations. This reduces significantly the range of mask parameters variations which should be searched for the best masks choice.

FIGS. 5A and 5B are high level schematic illustrations of illumination considerations in using target element types 100, according to some embodiments of the invention. Together with requirement for target sensitivity to focus deviations a successful F/D (focus dose) metrology may be configured to satisfy the requirements that the F/D metrology reflects deviations in scanner focus relative to device best focus and that the F/D metrology is robust to drift in scanner aberrations and to enable porting between scanners without the need for FEM re-calibration. To analyze how the proposed target archetypes 100 corresponds to the above requirements let us consider a dipole illumination configuration as an example (FIG. 5A). Illumination 80 is shown in the left diagram with L (left) and R (right) illumination poles, pupil plane image 130 with, from left to right, L0, R−1, L+1 and R0 (0 and ±1 designating the respective diffraction orders of the poles). In a range of pitches between the minimal design rule pitch and up to the almost twice the minimal design rule pitch the image projected on the wafer is formed as an interference between zero and +1 diffraction orders for the right illumination pole R and as an interference between zero and −1 diffraction orders for the left illumination pole L (FIG. 5A describes, in an exemplary non-limiting manner, the light distribution in the illumination pupil for the case where minimal design rule pitch is 128 nm and grating pitch on the mask is 200 nm).

If, for simplicity, the illumination poles are replaced with point light sources located at the centers of illumination poles the aerial image of symmetric by design target can be described in Equation 5 as $$I = A + B \cdot \cos(\Phi + 2\pi W_s + \alpha(z - Z_F)) \cdot \cos\left(\frac{2\pi}{P}x + 2\pi W_a\right) \quad \text{Expression 5}$$

with $W_s$ being the difference between symmetric aberrations in pupil points corresponding to the zero and ±1 diffraction orders, $W_a$ being the difference between anti-symmetric aberrations in pupil points corresponding to the zero and ±1 diffraction orders, $\Phi$ being the phase difference between zero and ±1 diffraction orders provided by a specific choice of the mask structure (discussed further below) and $\alpha(z-Z_F)$ being the phase shift between zero and ±1 diffraction orders caused by focus shift from the scanner focus position.

$$\alpha = \frac{2\pi}{\lambda}[\cos\theta_0 - \cos\theta_1],$$

where $\theta_0$ and $\theta_1$ are polar angles of the illumination plane waves corresponding to zero and first diffraction orders. In the point like illumination source framework the parameters $\alpha$, $W_s$ and $W_a$ depend only on location of center of poles and pitch and therefor are the same for any type of mask (with archetypes 100 as an example) with the same pitch. Moreover since for a given illumination poles location and target pitch on a mask $\alpha$ and $W_s$ are the same numbers for any target design the appearance of symmetric aberrations is equivalent to some focus shift $\Delta Z_F = W_s/\alpha$ the same for any target design.

To the right of FIG. 5A, results of PROLITH simulation of best focus position change with increase of symmetric aberration amplitude (primary spherical aberration) is calculated and presented for four archetypes 100 with pitch P~1.5·$P_{min}$ ($P_{min}$ being the minimal design rule pitch) for a finite illumination poles. The simulated results prove the correctness of all conclusions based on point light source approximation discussed above. FIG. 5B schematically illustrates quadruple illumination 80 with respective pupil image 130 and simulation results which show that the considerations presented above are correct for quadruple illumination as well. Similar analysis was carried out for annular illumination configurations, taking into account a truncated part of the annular illumination, and reaching the same conclusions. The simulation results further provide the corresponding rates of best focus position shift with increase of spherical aberration amplitude for the different illumination patterns.

In certain embodiments, target element types are configured to be symmetric and target element pitches $p_1$ are selected in the range between the minimal design rule pitch $P_{min}$ and twice the minimal design rule pitch ($P_{min} < P_1 < 2 \cdot P_{min}$). Such selection may be advantageous for focus metrology because of the following reasons:

1. The printed pattern pitch is unresolved by metrology tool (zero order metrology) so that asymmetric aberrations which cause a lateral shift of the printed pattern do not affect the measurement of focus and dose.
2. The shape of printed structures is not affected by changes in scanner aberrations except for a shift in best focus.
3. The shift in best focus of printed structures due to changes in scanner aberrations is the same for all symmetric structures of the same pitch including the device (but it does depend on pitch).
4. F/D metrology carried out on these structures is robust to changes in scanner aberrations and reflects true focus shifts with respect to the best focus of any device structure of the same pitch. It does not require re-calibration per scanner or when scanner aberrations drift.

Therefore, advantageously, focus metrology with multiple symmetric targets of the same pitch with $P_1 < 2 \cdot P_{min}$ automatically reports scanner focus relative to the best focus of the device (of the same pitch), does not require FEM re-calibration when scanner aberrations drift and enables porting between scanners without the need for FEM re-calibration.

An additional area in which disclosed focus offset targets can be applied is the best focus position measurement. Generally, the application of model-less approaches for the best focus position measurement is very problematic. Indeed, the best focus position is defined as a focus position where middle critical dimension (MCD) of the printed pattern approaches its extremum value (minimum or maximum depending on other lithography process parameters such as dose as an example). Accordingly, the MCD undergoes only slight changes in a focus range around the best focus position and as a results the behavior of the measured signal in this focus range is strongly affected by variations of other pattern parameters such as side wall angle (or more generally by profile variations), resist lost variations and etc. For example, SWA usually changed monotonically in this range which may lead to a significant mismatch between the measured signal extremum position and the required best focus position.

Figure 6:
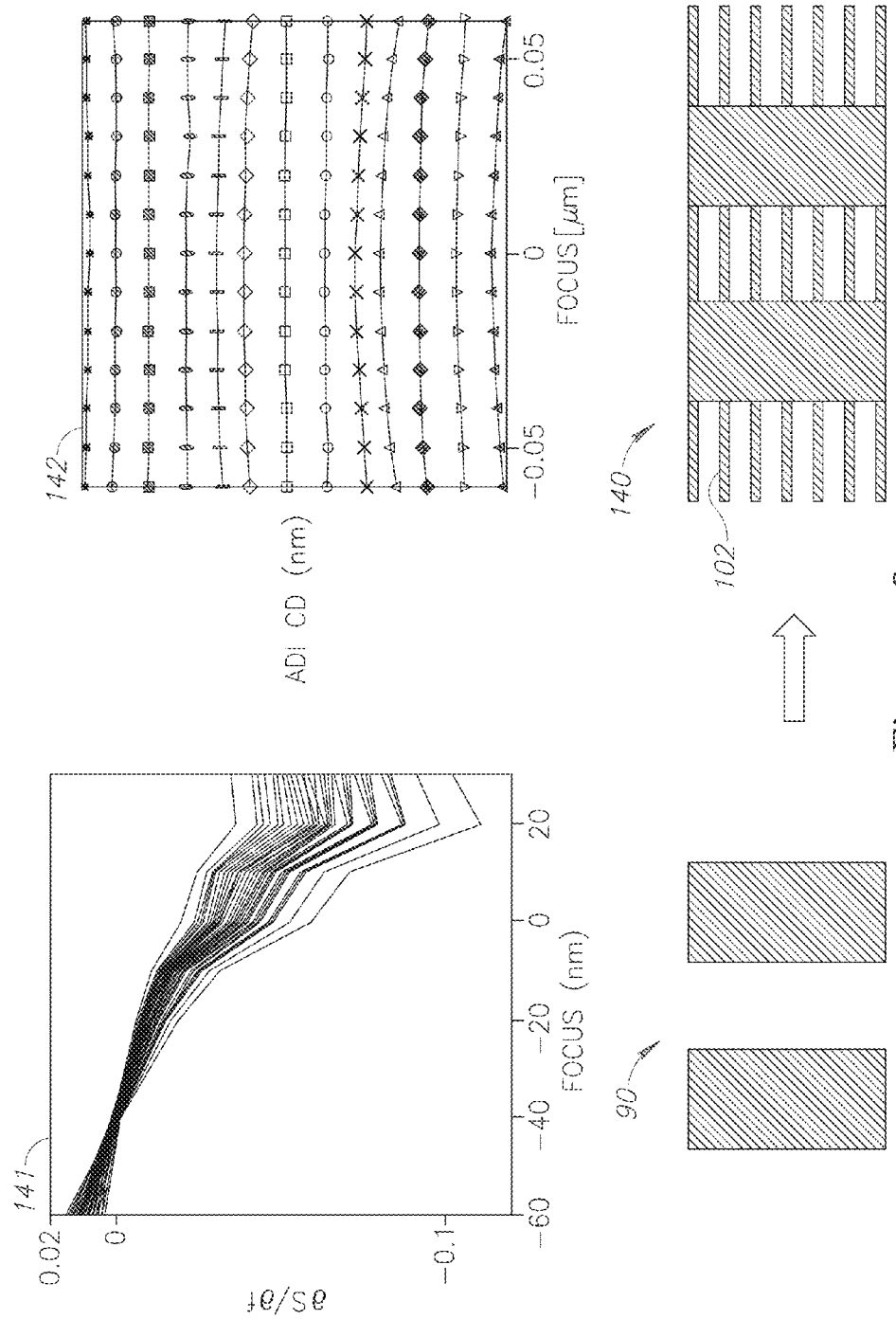
FIG. 6 is a high level schematic illustration of an example of the dependency of a signal derivative on the focus, according to prior art methods and a change from prior art targets to disclosed target elements with unresolved elements, according to some embodiments of the invention; and, FIG. 7 is a high level flowchart illustrating a method, according to some embodiments of the invention.

FIG. 6 is a high level schematic illustration of an example of the dependency of a signal derivative on the focus, according to prior art methods. In the example, the signal derivative is with respect to focus as a non-limiting example for a process parameter, the signal derivative ∂S/∂f 141 being calculated from FEM wafer without process variations (left) and is illustrated as a respective Bossung curve 142

(Focus-exposure matrices, ADI (After Develop Inspection) CD as function of the focus) for the same target (right). The bottom part of FIG. 6 illustrates the change from prior art targets 90 to disclosed target elements 140 with unresolved elements 102 (see below).

The comparison of the best focus position using the two types of analysis 141, 142 results in different focus positions—according to Bossung curve 142, the best focus position is around +5 nm whereas the best focus position calculated as a position of zero value of signal derivative 141 with respect to the focus ($\partial S/\partial f$) is around −35 nm to −40 nm. In other words for the best focus position definition there is a need to know not the derivative of the signal with respect to scanner focus position (which can be calculated using the printed FEM wafer) but the derivative of the MCD with respect to focus which can't be measured directly.

In the non-limiting case where the printed pattern can be described by only MCD and SWA (side wall angle) parameters (this is the case of the line space mask with pitch close to minimal design rule pitch), the signal derivative may be expressed as in Equation 6:

$$\frac{\partial S(\bar{x})}{\partial F} = \frac{\partial S(\bar{x})}{\partial MCD}\frac{\partial MCD}{\partial F} + \frac{\partial S(\bar{x})}{\partial SWA}\frac{\partial SWA}{\partial F} \qquad \text{Expression 6}$$

Here vector $\vec{x}$ states for detector pixels (it could be wavelength for spectroscopic tool or incidence angle for angle scatterometry tool). The sensitivity of signal to MCD change vector $$\frac{\partial S(\bar{x})}{\partial MCD}$$

can be calculated by comparing signals corresponding to different doses for the same locus position. In this case the variations of pattern profile is small and if there is no resist lost the main part of the signal change can be associated with MCD change. Using the fact that cross-correlation between sensitivity to MCD and sensitivity to SWA vectors is small ~0.1 the derivative of MCD with respect to focus can be approximately calculated as in Equation 7:

$$\frac{\partial MCD}{\partial F} \cong \frac{\int \frac{\partial S(\bar{x})}{\partial F} \cdot \frac{\partial S(\bar{x})}{\partial MCD} d\bar{x}}{\int \frac{\partial S(\bar{x})}{\partial MCD} \cdot \frac{\partial S(\bar{x})}{\partial MCD} d\bar{x}} \qquad \text{Expression 7}$$

The position of zero value of Expression 7 should be much more close to the true best focus position defined from Bossung curve 142.

The signal derivative with respect to dose can be calculated from the FEM wafer by subtracting signals corresponding different doses for the same scanner focus positions. This procedure can be done per scanner focus position and the derivative of the signal with respect to dose can be calculated as function of focus position. However, basing on FEM wafer approach errors are introduced, which are associated with process variations between different sites. In order to provide more accurate measurement of the best focus position, the local exposure matrix (per site) may be used. For this purpose two targets can be printed at each side where one of the targets is the basic line space target the best focus position of which is required to be measured whereas the second target corresponds to the special mask design providing a printed pattern which can be obtained for the first target but with different dose. Indeed, for targets with pitch less than twice minimal design rule pitch the aerial image is described by Equation 1 where A, B and $\Phi$ are determined by the illumination conditions, mask parameters and target design. The dose change corresponds to the proportional change of coefficients A and B so that $A \Rightarrow A \cdot (1+\delta)$ and $B \Rightarrow B \cdot (1+\delta)$. So that in order to mimic the dose change one can use target design providing the similar proportional change of coefficients A and B. An example of such target designs is shown in the bottom of FIG. 6 which illustrates target design 140 mimicking dose change by using unresolved segmentation 102 (for example in the direction perpendicular to the grating direction).

In certain embodiments, a full local focus and exposure matrix may be printed. For example, a six cells' target consisting comprising three pairs that mimic dose changes at different focus positions. For example, the six cells may correspond to the following aerial images:
1. $A \cdot (1+\delta)$, $B \cdot (1+\delta)$, $-\Phi_1$.
2. A, B, $-\Phi_1$.
3. $A \cdot (1+\delta)$, $B \cdot (1+\delta)$, 0.
4. A, B, 0.
5. $A \cdot (1+\delta)$, $B \cdot (1+\delta)$, $\Phi_2$.
6. A, B, $\Phi_2$.

For each pair the parameter $$\frac{\partial MCD}{\partial F}$$

may be calculated in accordance with Expression 7. Furthermore, using parabolic approximation the focus position corresponding to zero value of the above parameter may be calculated.

Target design files for producing targets with target element types 100 are likewise considered part of the present invention, as are any design adaptations according to the disclosed principles.

FIG. 7 is a high level flowchart illustrating a method 200, according to some embodiments of the invention. Any stage of method 200 may be carried out by respective software and/or hardware, and possibly at least partially implemented as a computer program product comprising a non-transitory computer readable storage medium having computer readable program embodied therewith, the computer readable program configured to carry out at least part of at least one of the method stages. Method 200 may comprise generating target design files for targets with disclosed target element types as well as design adaptations according to the disclosed principles.

Method 200 comprises designing a metrology target using target elements belonging, e.g., to two to five target element types, each type comprising unresolved features which offset production parameter(s) to a specified extent (stage 205) and/or Shifting production sensitivity of the parameters to around the tool focus position (stage 210).

Method 200 may comprise using mutually parallel unresolved features (stage 212), using mutually perpendicular unresolved features (stage 214) and/or using combinations of parallel and perpendicular segments of a target structure (stage 215) and possibly interconnecting at least some of the segments (stage 217).

Method 200 may comprise configuring the ratio of parallel and perpendicular segments of the target structure to determine the specified extent of the offset or the shift (stage 220).

Method 200 may comprise selecting target element pitch to be between one and two times the minimal design rule pitch (stage 225) and finally modifying scanner focus and/or dose using the target element types (stage 230).

Data processing stages and control stages may be implemented by respective processors and algorithms may be implemented by respective computer program product(s) comprising a computer usable medium having computer usable program code tangibly embodied thereon, the computer usable program code configured to carry out at least part of the respective stages.

Advantageously, the disclosed new target design concepts allow designing focus-offset targets without knowing full information about lithography and process conditions. The suggested targets automatically report scanner focus or other process parameters relative to the best focus of the device (of the same pitch), without requiring FEM re-calibration when scanner aberrations drift. The new targets enable porting between scanners without the need for FEM re-calibration and provide local FEM on each site.

In certain embodiments, the suggested approach allows design of targets which are sensitive to scanner focus changes without knowing any information about lithography and process parameters but light source polarization scheme or with knowing only full information about scanner illumination scheme. Specific choice of target pitch between minimal design rule pitch (MDRP) and two times MDPR allows separation between focus measurement and effects of scanner aberrations. The new target design further allows printing of local FEM on each site which reduces the effect of process variations on measurement of the best focus position as an example. The new sensitive target designs and new approaches for focus and dose measurement may provide a good basis for road map for the next nodes.

In certain embodiments, respective measurement algorithms and procedures may be implemented in hardware and/or software, integrated in metrology tools and/or provided as independent module(s) for use in focus and dose control. Due to a high sensitivity of disclosed targets to scanner focus changes, accurate scanner focus measurement is enabled without full modeling based only on FEM wafer or\and partially modeling approach.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target, comprising:
a plurality of printed elements, wherein a profile of at least one printed element of the plurality of printed elements is sensitive to deviations of at least one production parameter within a process window, wherein the plurality of printed elements corresponds to at least two target element types on a pattern mask, wherein each of the at least two target element types comprises one or more unresolved features which determine a sensitivity of a portion of the plurality of printed elements to the deviations of the at least one production parameter to a specified extent within the process window.

2. The metrology target of claim 1, wherein the one or more unresolved features are mutually parallel.

3. The metrology target of claim 1, wherein the one or more unresolved features are mutually perpendicular.

4. The metrology target of claim 1, wherein the one or more unresolved features comprise:
at least one of perpendicular segmentations of a target element type of the at least two target element types or parallel segmentations of a target element type of the at least two target element types.

5. The metrology target of claim 4, wherein the perpendicular segmentations and the parallel segmentations are interconnected.

6. The metrology target of claim 1, wherein the unresolved features are configured to determine the sensitivity according to a ratio of parallel segmentations and perpendicular segmentations of a target element type of the at least two tartlet element types.

7. The metrology target of claim 1, wherein the at least one production parameter comprises:
scanner focus and dose.

8. The metrology target of claim 1 wherein the at least one specified production parameter comprises:
at least one of scanner focus or dose.

9. The metrology target of claim 1, wherein the plurality of printed elements are designed at a pitch between a minimal design rule pitch and twice the minimal design rule pitch.

10. A target design file of the metrology target of claim 1.

11. The metrology target of claim 1, wherein the profile of the at least one printed element of the plurality of printed elements includes at least one of a sidewall angle or a critical dimension.

12. A method, comprising:
designing a pattern mask for the production of a plurality of printed elements of a metrology target, wherein a profile of at least one printed element of the plurality of printed elements is sensitive to deviations of at least one production parameter within a process window, wherein the pattern mask includes at least two target element types, wherein each of the at least two target element types comprises one or more unresolved features which determine a sensitivity of a portion of the plurality of printed elements to the deviations of the at least one production parameter to a specified extent within the process window.

13. The method of claim 12, wherein the at least two target element types include mutually parallel unresolved features.

14. The method of claim 12, wherein the at least two target element types include mutually perpendicular unresolved features.

15. The method of claim 12, wherein the at least two target element types include combinations of parallel segments and perpendicular segments.

16. The method of claim 15, wherein at least some of the combinations of parallel segments and perpendicular segments are interconnected.

17. The method of claim 15, further comprising:
configuring a ratio of the parallel segments and the perpendicular segments to determine the specified extent within the process window.

18. The method of claim 12, wherein the at least one production parameter comprises:
scanner focus and dose.

19. The method of claim 12, wherein the at least one production parameter comprises:
at least one of scanner focus or dose.

20. The method of claim 12, further comprising:
selecting a target element type pitch to be between a minimal design rule pitch and twice the minimal design rule pitch.

21. A pattern mask comprising:
at least two target element types for the production of a plurality of printed elements of a metrology target, wherein a profile of at least one printed element of the plurality of printed elements is sensitive to deviations of at least one production parameter within a process window, wherein each of the at least two target element types comprises one or more unresolved features which determine a sensitivity of a portion of the plurality of printed elements to the deviations of the at least one production parameter to a specified extent within the process window.

22. A lithography system comprising:
an illumination source;
one or more projection optical elements; and
a pattern mask, wherein the one or more projection optical elements are configured to expose a sample with an image of the pattern mask, wherein a profile of at least one printed element of a plurality of printed elements on the sample associated with the image of the pattern mask is sensitive to deviations of at least one production parameter within a process window, wherein the pattern mask includes at least two target element types, wherein each of the at least two target element types comprises one or more unresolved features which determine a sensitivity of a portion of the plurality of printed elements to the deviations of the at least one production parameter to a specified extent within the process window.

* * * * *